(12) United States Patent
Shin et al.

(10) Patent No.: US 11,217,578 B2
(45) Date of Patent: Jan. 4, 2022

(54) RESISTOR WITH DOPED REGIONS

(71) Applicant: Samsung Electronics Co., Ltd., Suwon-si (KR)

(72) Inventors: Woocheol Shin, Seoul (KR); Myunggil Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/911,795

(22) Filed: Jun. 25, 2020

(65) Prior Publication Data

US 2021/0175230 A1 Jun. 10, 2021

(51) Int. Cl.
| | |
|---|---|
| *H01L 27/06* | (2006.01) |
| *H01L 49/02* | (2006.01) |
| *H01L 29/06* | (2006.01) |
| *H01L 29/417* | (2006.01) |
| *H01L 29/423* | (2006.01) |
| *H01L 29/786* | (2006.01) |
| *H01L 21/02* | (2006.01) |
| *H01L 29/66* | (2006.01) |

(52) U.S. Cl.
CPC .... *H01L 27/0629* (2013.01); *H01L 21/02532* (2013.01); *H01L 21/02603* (2013.01); *H01L 28/20* (2013.01); *H01L 29/0673* (2013.01); *H01L 29/41733* (2013.01); *H01L 29/42392* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC ........... H01L 27/0629; H01L 21/02532; H01L 21/02603; H01L 28/20; H01L 29/0673; H01L 29/41733; H01L 29/42392; H01L 29/66545; H01L 29/66553; H01L 29/66742; H01L 29/78618; H01L 29/78696
USPC ...................................................... 257/350
See application file for complete search history.

(56) References Cited

U.S. PATENT DOCUMENTS

| | | |
|---|---|---|
| 8,796,772 B2 | 8/2014 | Yeh et al. |
| 9,520,458 B2 | 12/2016 | Kang et al. |

(Continued)

FOREIGN PATENT DOCUMENTS

| | | |
|---|---|---|
| KR | 20000027230 A | 5/2000 |
| KR | 20000027906 A | 5/2000 |

*Primary Examiner* — Tong-Ho Kim
(74) *Attorney, Agent, or Firm* — Harness, Dickey & Pierce, P.L.C.

(57) ABSTRACT

A resistor includes a substrate including an active region protruding from an upper surface of the substrate and extending in a first horizontal direction, a doped region extending in the first horizontal direction on the active region and comprising a semiconductor layer with n-type impurities, a plurality of channel layers spaced apart from each other in a vertical direction on the active region and connected to the doped region, a first gate electrode and a second gate electrode extending in the second horizontal direction intersecting the first horizontal direction and surrounding the plurality of channel layers, a first contact plug and a second contact plug in contact with an upper surface of the doped region. The first contact plug is adjacent to the first gate electrode. The second contact plug is adjacent to the second gate electrode.

20 Claims, 14 Drawing Sheets

(56) References Cited

U.S. PATENT DOCUMENTS

| | | |
|---|---|---|
| 9,595,518 B1 | 3/2017 | Chou et al. |
| 9,812,444 B2 | 11/2017 | Hu et al. |
| 9,991,328 B2 | 6/2018 | Bi et al. |
| 2016/0351570 A1* | 12/2016 | Park ................ H01L 21/823814 |
| 2018/0308837 A1 | 10/2018 | Bi et al. |
| 2019/0206980 A1 | 7/2019 | Jan et al. |
| 2021/0028164 A1* | 1/2021 | Shin ................ H01L 21/823431 |

* cited by examiner

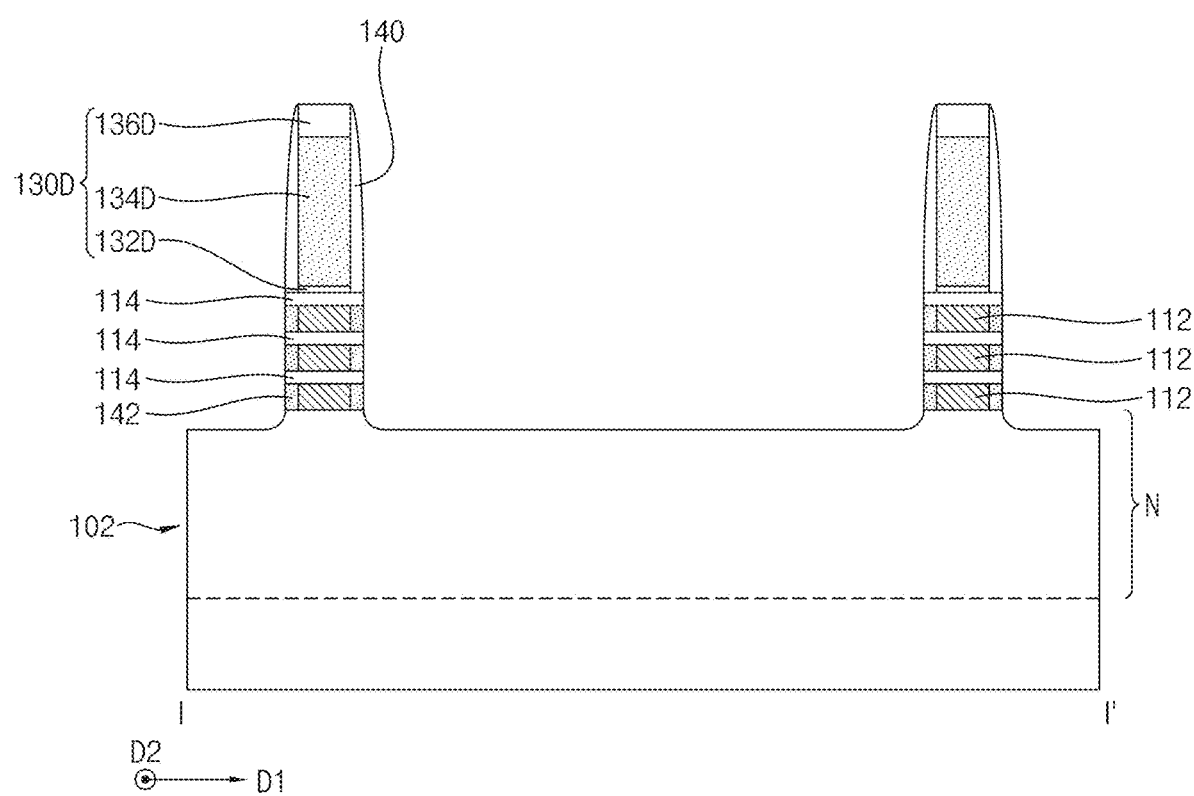

RESISTOR WITH DOPED REGIONS

CROSS-REFERENCE TO RELATED APPLICATION

This application claims from Korean Patent Application No. 10-2019-0162831, filed on Dec. 9, 2019, the disclosure of which is incorporated herein by reference in its entirety.

BACKGROUND

1. Field

Devices consistent with example embodiments relate to resistor with doped regions.

2. Description of Related Art

With the demand for high integration and miniaturization of semiconductor devices, the size of transistors of semiconductor devices has also been miniaturized. Accordingly, a transistor having a multi-channel has been proposed to miniaturize the size of a transistor and limit and/or prevent a short channel effect. On the other hand, a logic circuit requires a resistor together with a transistor.

SUMMARY

According to some example embodiments, a resistor may include a substrate including an active region protruding from an upper surface of a substrate, the active region extending in a first horizontal direction; a doped region extending in the first horizontal direction and comprising a semiconductor layer with n-type impurities; a plurality of channel layers spaced apart from each other in a vertical direction on the active region, the plurality of channel layers connected to the doped region; a first gate electrode and a second gate electrode adjacent to the doped region and extending in a second horizontal direction intersecting the first horizontal direction, the first gate electrode and the second gate electrode surrounding the plurality of channel layers; and a first contact plug and a second contact plug in contact with an upper surface of the doped region, the first contact plug between the first gate electrode and the second gate electrode. The first contact plug may be adjacent to the first gate electrode, and the second contact plug may be adjacent to the second gate electrode.

According to some example embodiments, a resistor may include a substrate including a plurality of first active regions protruding from an upper surface of a substrate, the plurality of first active regions extending in a first horizontal direction; a resistive structure including a semiconductor layer with a plurality of first doped regions connected to each other, each of the plurality of first doped regions being on the plurality of the first active regions and including n-type impurities; a plurality of channel layers spaced apart from each other in a vertical direction on the active region, each of the plurality of channel layers being connected to the plurality of first doped regions; a first gate electrode extending in a second horizontal direction intersecting the first horizontal direction, the first gate electrode surrounding the plurality of channel layers; and at least one first contact plug in contact with an upper surface of the resistive structure and adjacent to the first gate electrode.

According to some example embodiments, a resistor may include a substrate including an active region and an N-well, the active region protruding from an upper surface of the substrate and extending in a first horizontal direction, the N-well in the substrate and surrounding the active region; a doped region on the active region and comprising a semiconductor layer with n-type impurities, a maximum width of the doped region in a second horizontal direction intersecting the first horizontal direction being 52 nm to 60 nm; a plurality of channel layers spaced apart from each other in a vertical direction on the active region, the plurality of channel layers connected to the doped region; inner spacers in contact with side surfaces of the doped region, the inner spacers on lower surfaces of the plurality of channel layers; a gate dielectric layer surrounding the plurality of channel layers; a first gate electrode and a second gate electrode extending in the second horizontal direction and surrounding the plurality of channel layers and the gate dielectric layer; and a first contact plug and a second contact plug in contact with an upper surface of the doped region, the first contact plug between the first gate electrode and the second gate electrode. The first contact plug may be adjacent to the first gate electrode, and the second contact plug may be adjacent to the second gate electrode.

BRIEF DESCRIPTION OF THE DRAWINGS

The above and other objects, features, and effects of inventive concepts will become more apparent to those of ordinary skill in the art by describing example embodiments thereof in detail with reference to the accompanying drawings, in which:

FIGS. 5A-12B are vertical cross-sectional views illustrating in a process order of a method of manufacturing a resistor according to an example embodiment of inventive concepts.

DETAILED DESCRIPTION

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1:
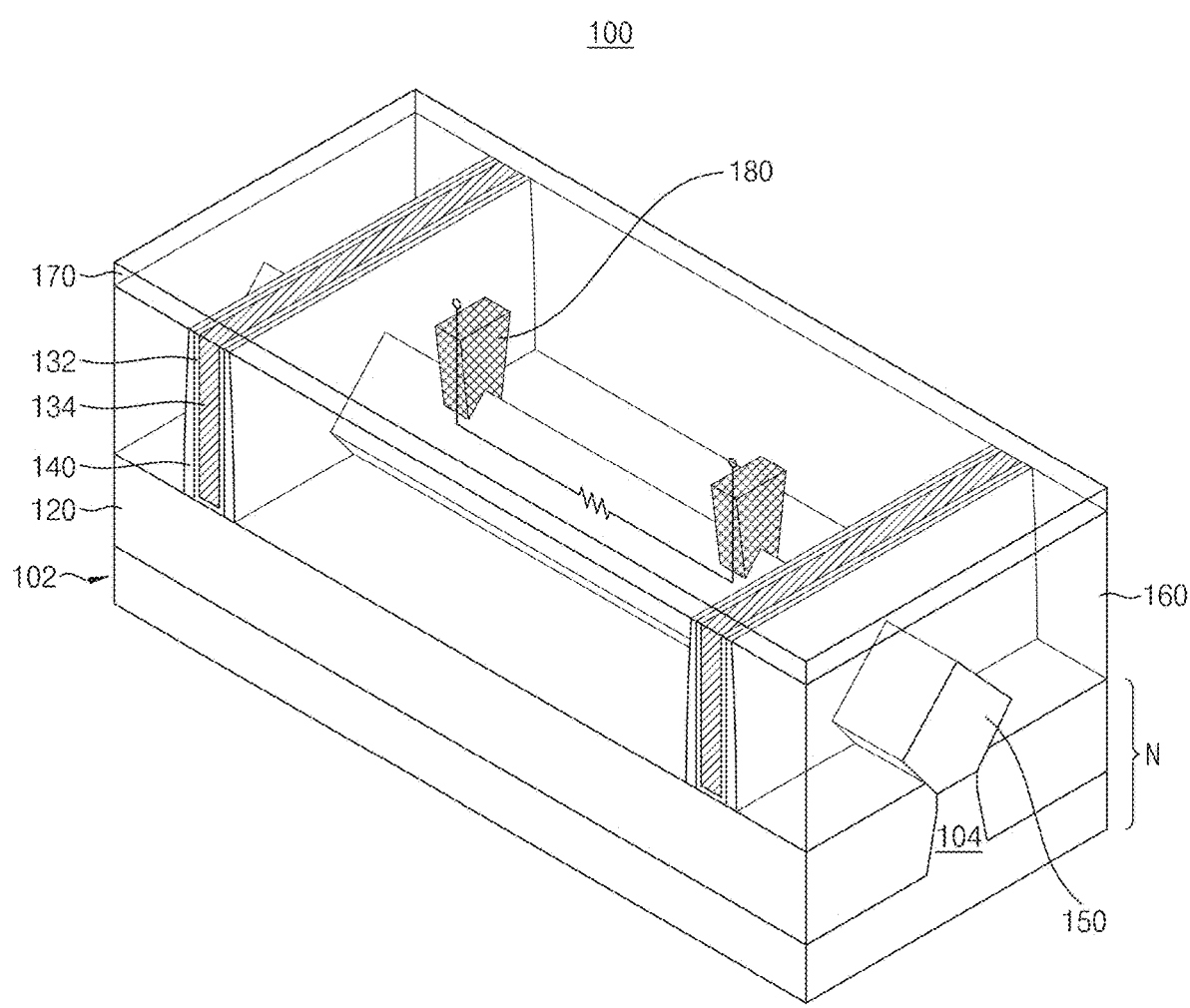
FIG. 1 is a perspective view of a resistor according to an example embodiment of inventive concepts.
Figure 2:
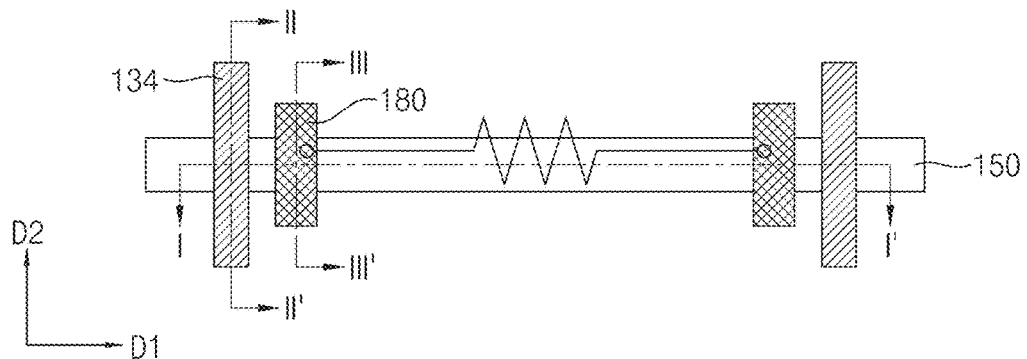
FIG. 2 is a layout of the resistor shown in FIG. 1.
Figure 3A:
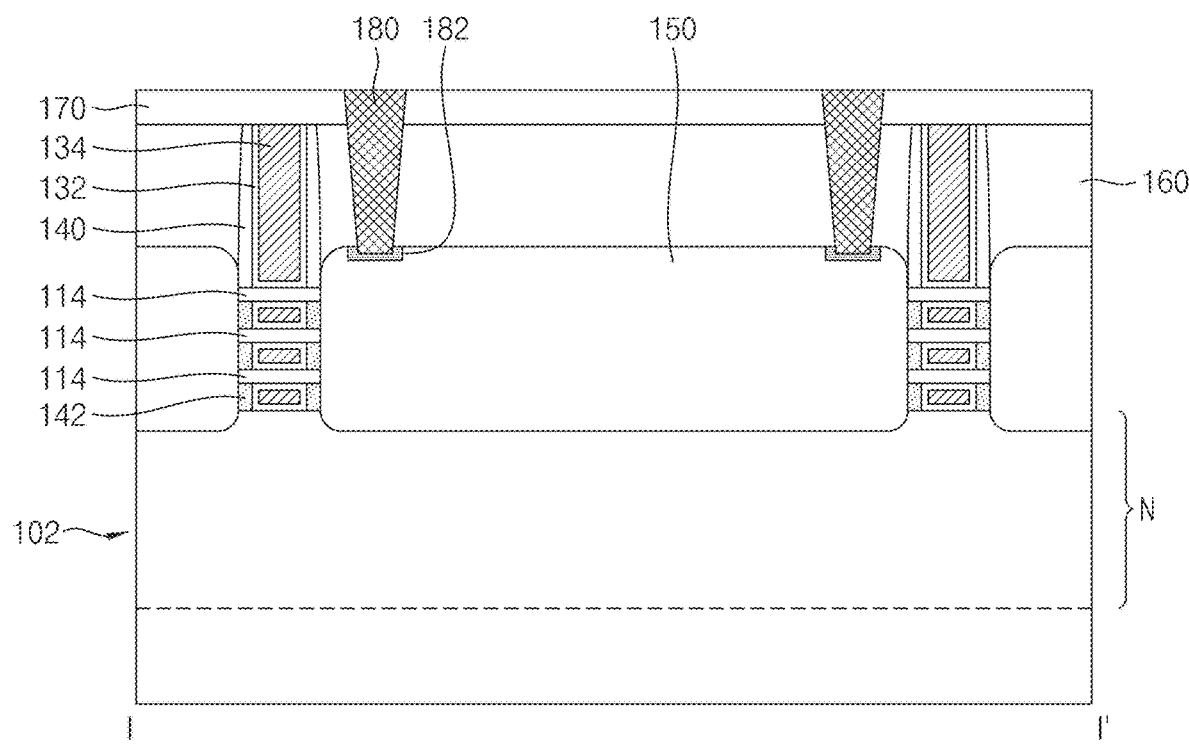
FIGS. 3A-3B are vertical cross-sectional views of the resistor shown in FIG. 2, taken along lines I-I', II-II' and III-III'.
Figure 3B:
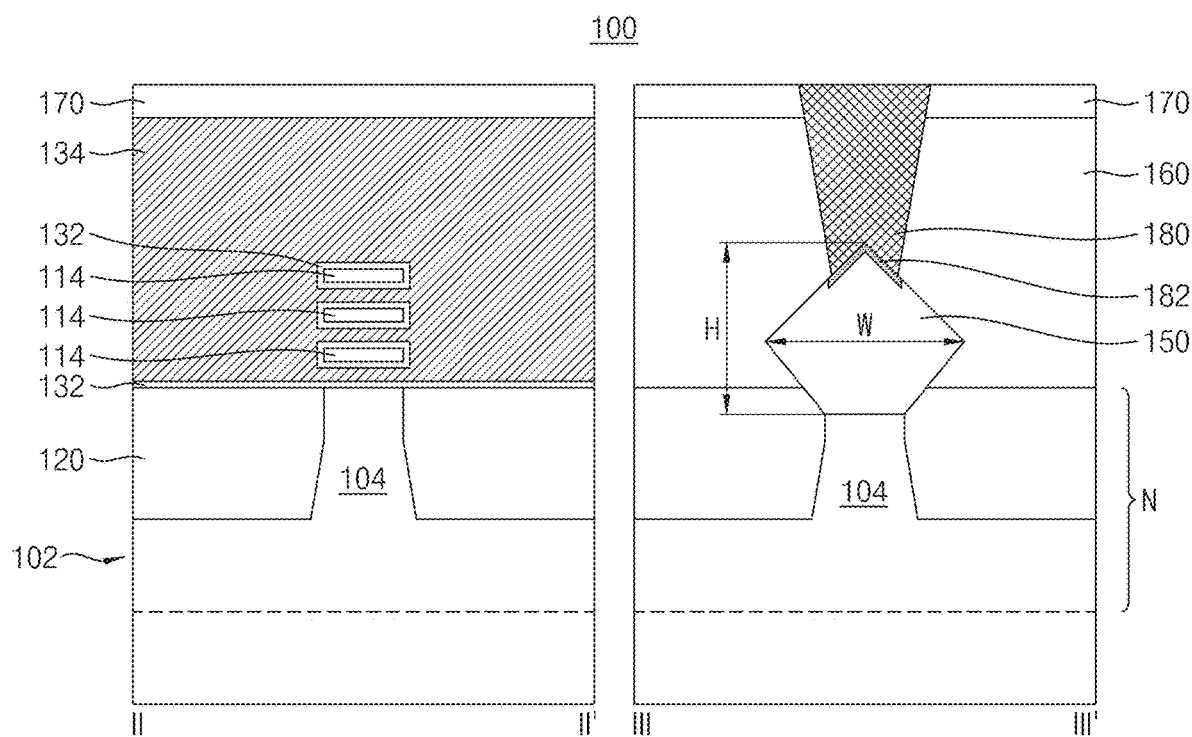

FIG. 1 is a perspective view of a resistor according to an example embodiment of inventive concepts. FIG. 2 is a layout of the resistor shown in FIG. 1. FIGS. 3A-3B are vertical cross-sectional views of the resistor shown in FIG. 2, taken along lines I-I', II-II', and III-III'.

Referring to FIGS. 1-3B, a resistor 100 may include a substrate 102, a channel layer 114, a device isolation layer 120, a gate electrode 134, and a doped region 150, an interlayer insulating layer 160, a capping layer 170, and a contact plug 180.

The substrate 102 may include a semiconductor material. For example, the substrate 102 may be a silicon substrate, a germanium substrate, a silicon germanium substrate, or a silicon on insulator (SOI) substrate. In an example embodiment, the substrate 102 may be a p-type substrate, and the substrate 102 may include an N-well N thereon. An active region 104 may protrude from an upper surface of the substrate 102, and may be extend in a first horizontal direction D1. The N-well N may surround the active region 104.

The plurality of channel layers 114 may be spaced apart from each other in a direction perpendicular to the upper surface of the substrate 102. The plurality of channel layers 114 may be electrically connected to each other through the doped region 150. FIG. 3B shows the channel layer 114 in the form of a nanosheet having a rectangular cross section, but is not limited thereto. In an example embodiment, the cross section of the channel layer 114 may be circular or elliptical. In an example embodiment, the channel layer 114 may include a group IV semiconductor such as Si, Ge, or SiGe or a III-V compound semiconductor such as InGaAs, InGaAs, InAs, GaSb, InSb, and the like.

The device isolation layer 120 may be disposed on the upper surface of the substrate 102 and may define the active region 104. The device isolation layer 120 may cover the upper surface of the substrate 102 and side surfaces of the active region 104. An upper surface of the active region 104 may be located at the same level as an upper surface of the device isolation layer 120. In an example embodiment, the device isolation layer 120 may include silicon oxide, silicon nitride, silicon oxynitride, or low-K dielectric material.

A gate dielectric layer 132 and a gate electrode 134 may surround the channel layer 114. The gate dielectric layer 132 may extend in a second horizontal direction D2 and cover upper surfaces of the active region 104 and the device isolation layer 120. In addition, the gate dielectric layer 132 may surround surfaces of the channel layer 114. The gate electrode 134 may extend in the second horizontal direction D2 and cover the channel layer 114 and the gate dielectric layer 132. The gate electrodes 134 may be disposed adjacent to the doped region 150. The gate dielectric layer 132 may include a material having a high dielectric constant (high-k), such as hafnium oxide and hafnium oxy-nitride. The gate electrode 134 may include aluminum, copper, titanium, tantalum, tungsten, molybdenum, tantalum nitride, nickel silicide, cobalt silicide, TiN, WN, TiAl, TiAlN, TaCN, TaC, TaSiN, metal alloys or combinations thereof. You can. In an example embodiment, the gate electrode 134 may include tungsten.

A gate spacer 140 may be disposed outside the gate electrode 134. For example, the gate spacer 140 may be disposed to face each other with the gate electrode 134 therebetween, and may extend in the second horizontal direction D2. The gate spacer 140 may be formed of one or more layers.

Inner spacers 142 may be disposed on both sides of the gate electrode 134 along the second horizontal direction D2. The inner spacer 142 may be disposed on lower surfaces of each channel layer 114 and may contact an outer surface of the doped region 150. The inner spacer 142 may electrically separate the gate electrode 134 from the doped region 150. In an example embodiment, the inner spacer 142 may include silicon nitride.

The doped region 150 may be disposed on the active region 104 and may be disposed on the side of the gate electrode 134. For example, the doped region 150 may be disposed between two adjacent gate electrodes 134. The doped region 150 may be a semiconductor layer epitaxially grown from the active region 104. The doped region 150 may be doped with the same conductivity type as the N-well. For example, the doped region 150 may include n-type impurities. In an example embodiment, the doped region 150 may include n-type impurities having a concentration higher than that of the N-well. Since the doped region 150 is doped with the same conductivity type as the N-well, the resistor 100 can function as a resistive wiring, not as a transistor. The maximum width W of the second horizontal direction D2 of the doped region 150 may be 52 nm to 60 nm. The height H of the doped region 150 may be 52 nm to 58 nm. The length in the first horizontal direction D1 of the doped region 150 may be equal to or greater than about 100 nm. For example, the length in the first horizontal direction D1 of the doped region 150 may be 100 nm to 800 nm. In an example embodiment, the distance between two adjacent gate electrodes 134 may be equal to or greater than about 100 nm.

The interlayer insulating layer 160 may cover the gate spacer 140 and the doped region 150. The interlayer insulating layer 160 may include silicon oxide, silicon nitride, silicon oxynitride, or a low dielectric material, and may be composed of one or more layers. Low dielectric materials include, for example, Undoped Silica Glass (USG), Borosilica Glass (BSG), PhosphoSilica Glass (PSG), BoroPhosphoSilica Glass (PSG), Plasma Enhanced Tetra Ethyl Ortho Silicate (PETOS), Fluoride Silicate Glass (FSG), HDP (High Density Plasma) oxide, SiOH, SiCo, SiCOH, or a combination thereof.

The capping layer 170 may be disposed on the interlayer insulating layer 160. The capping layer 170 may cover the upper surfaces of the gate electrode 134, the gate spacer 140, and the interlayer insulating layer 160. The capping layer 170 may include silicon oxide, silicon nitride, silicon oxynitride, or a combination thereof.

The contact plug 180 may penetrate the interlayer insulating layer 160 and the capping layer 170 vertically to contact an upper surface of the doped region 150. The contact plug 180 may be disposed adjacent to the gate electrode 134. The contact plug 180 may be electrically connected to the doped region 150. A silicide layer 182 may be further disposed below the contact plug 180. The silicide layer 182 may be disposed between the doped region 150 and the contact plug 180. Although not illustrated, a diffusion barrier may be disposed surrounding side and bottom surfaces of the contact plug 180. The contact plug 180 may include W, Co, Cu, Al, Ti, Ta, TiN, TaN, or a combination thereof. The silicide layer 182 may be formed by a portion of the doped region 150 and the contact plug 180 being silicided.

As shown in FIGS. 1, 2, 3A and 3B, the resistor 100 of the present disclosure may be implemented in a gate all-around structure having a channel layer 114 in the form of a nanosheet. The contact plugs 180 may be disposed between the adjacent gate electrodes 134 and may be connected to the doped region 150. The contact plugs 180 may be electrically connected to each other through the doped region 150. The resistance of the resistor 100 may vary depending on the size and doping concentration of the doped region 150 between the contact plugs 180. For example, if the distance between the contact plugs 180 increases, the resistance of the resistor 100 may increase.

Alternatively, if the cross-sectional area of the doped region increases, the resistance of the resistor 100 may decrease. In an example embodiment, the doped region 150 may be connected to three channel layers 114 spaced apart in the vertical direction. In an example embodiment, the doped region 150 may be connected to more than four channel layers 114 spaced apart in the vertical direction.

Figure 4:
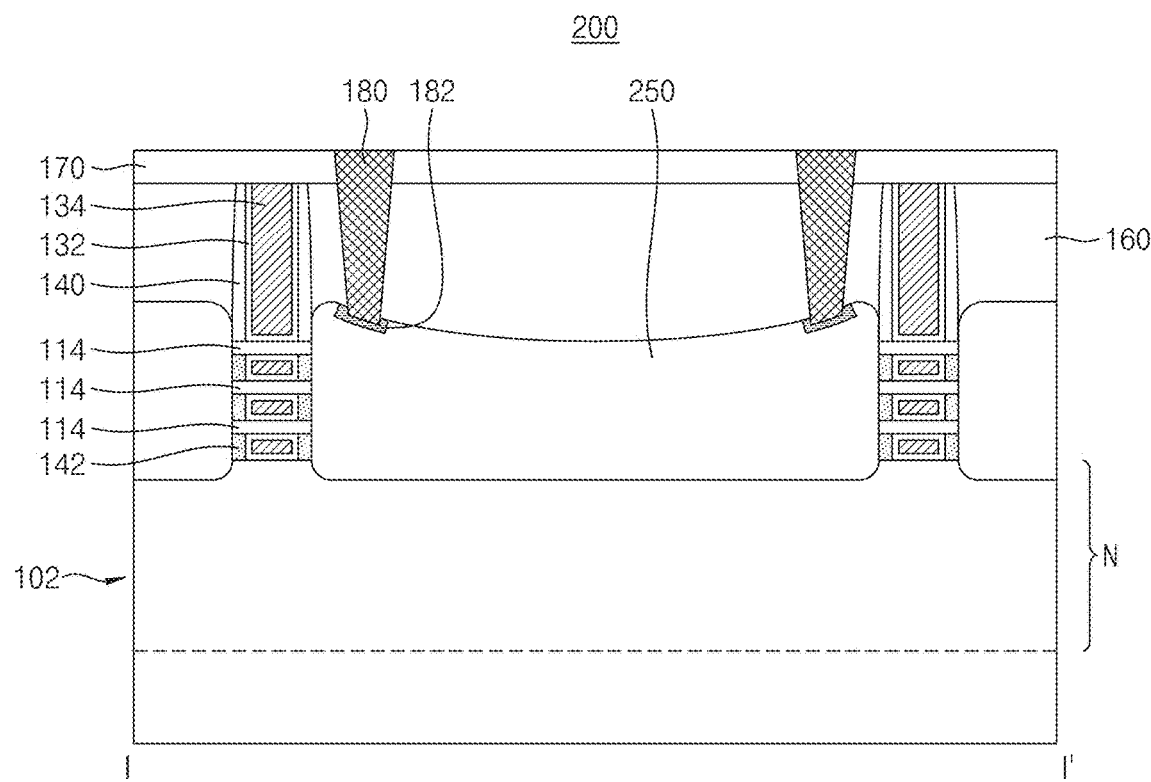
FIG. 4 is a vertical cross-sectional view of a resistor according to an example embodiment of inventive concepts.

FIG. 4 is a vertical cross-sectional view of a resistor according to an example embodiment of inventive concepts.

Referring to FIG. 4, a resistor 200 may include a doped region 250 disposed on the active region 104 and connected to the contact plug 180. In an example embodiment, the distance between the gate electrodes 134 of the resistor 200 may be greater than the distance between the gate electrodes (not shown) of transistor. The doped region 250 of the resistor 200 may be formed together with the source/drain regions of the transistor. The distance between the gate electrodes 134 of the resistor 200 is relatively large, and the doped region 250 may not be sufficiently filled in the space between the gate electrodes 134. For example, an upper surface of the doped region 250 may have a concave intermediate portion. Alternatively, both ends of the first horizontal direction D1 of the doped region 150 may be positioned at a level higher than the center of the doped region 150.

FIGS. 5A-12B are vertical cross-sectional views illustrating in a process order of a method of manufacturing a resistor according to an example embodiment of inventive concepts.

Specifically, FIGS. 5A, 6A, 7A, 8, 9A, 10A, 11A, and 12A are vertical cross-sectional views corresponding to the line I-I' of FIG. 2, respectively. FIGS. FIGS. 5B, 6B, 7B, 9B, 10B, 11B, and 12B are vertical cross-sectional views corresponding to the lines II-II' and III-III' of the FIG. 2, respectively.

Figure 5A:
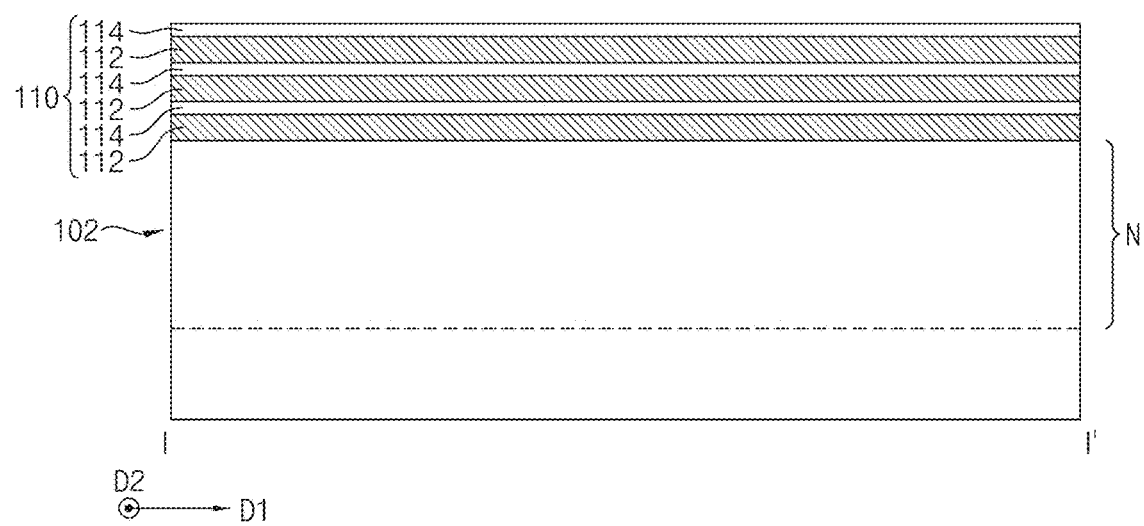
Figure 5B:
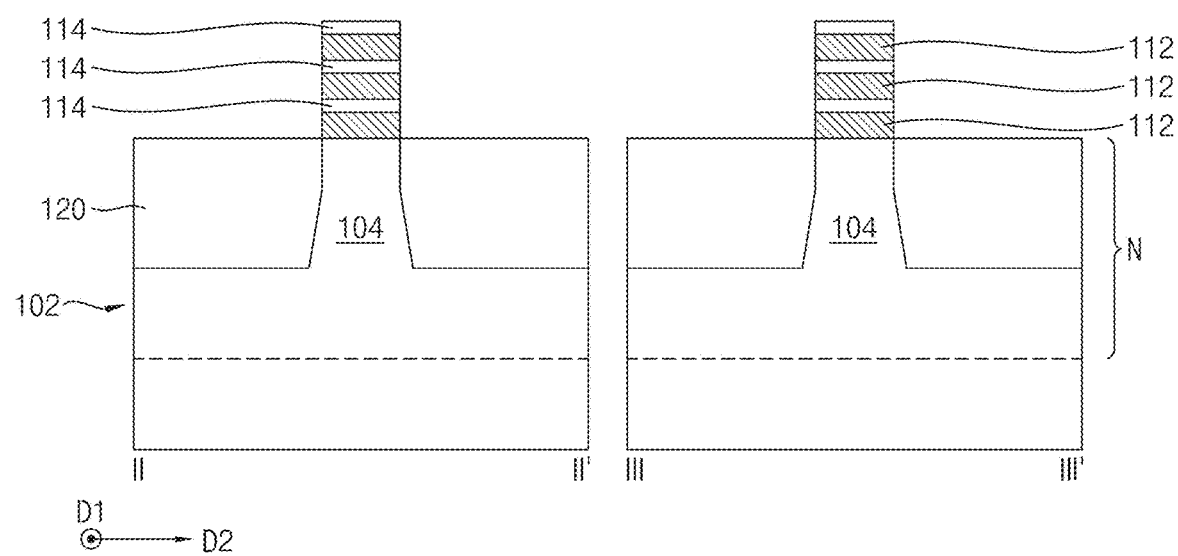

Referring to FIGS. 5A and 5B, a stack 110 may be formed on a substrate 102. The stack 110 may include a plurality of sacrificial layers 112 and channel layers 114 alternatively stacked. In an example embodiment, the substrate 102 may be a p-type semiconductor substrate, and may include an N-well thereon. The substrate 102 and the stack 110 may be patterned to form a device isolation layer 120 on an upper surface of the substrate 102. An active region 104 of the substrate 102 may be defined by the device isolation layer 120. The active region 104 may extend in the a first horizontal direction D1 and may be protrude from the substrate 102. The device isolation layer 120 may be formed to cover the upper surface of the substrate 102 and side surface of the active region 104. An upper surface of the active region 104 may be located at the same level as an upper surface of the device isolation layer 120. The patterned stack 110 may extend in the first horizontal direction D1 on the active region 104.

In an example embodiment, the channel layer 114 may include the same material as the substrate 102. The sacrificial layer 112 may include a material having an etch selectivity with the channel layer 114. For example, the sacrificial layer 112 may include SiGe, and the channel layer 114 may include Si. The device isolation layer 120 may include silicon oxide, silicon nitride, silicon oxynitride, or low dielectric material.

Figure 6A:
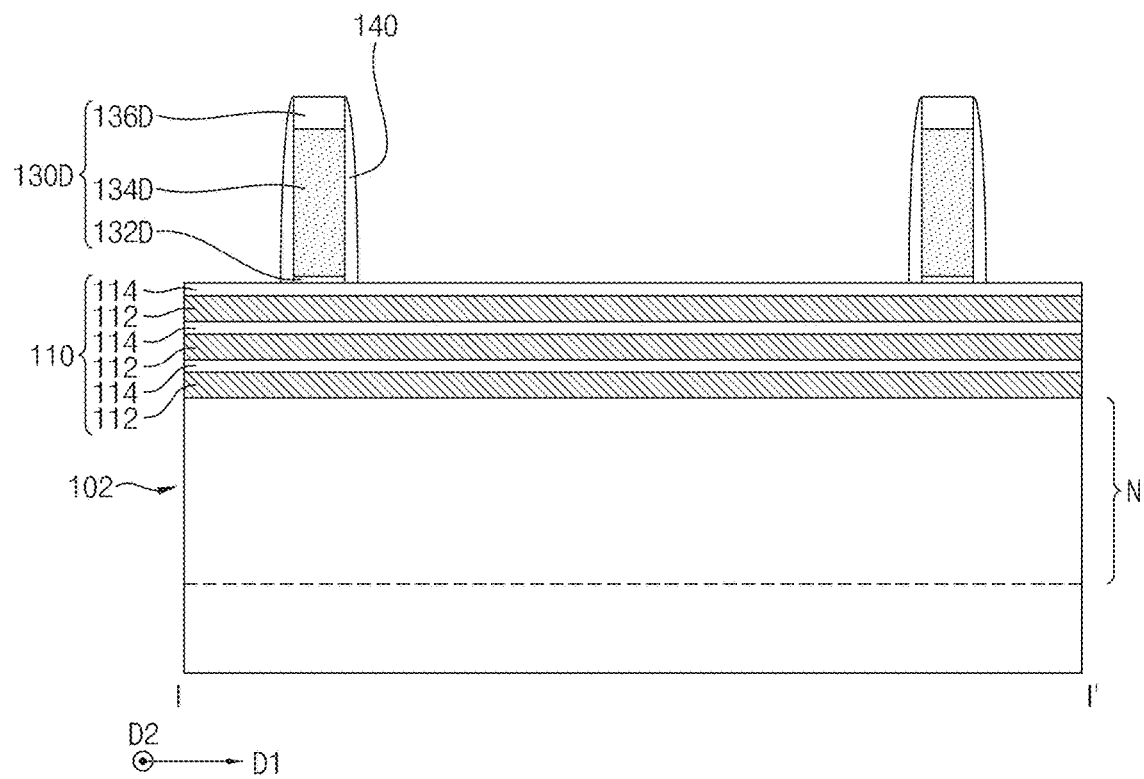
Figure 6B:
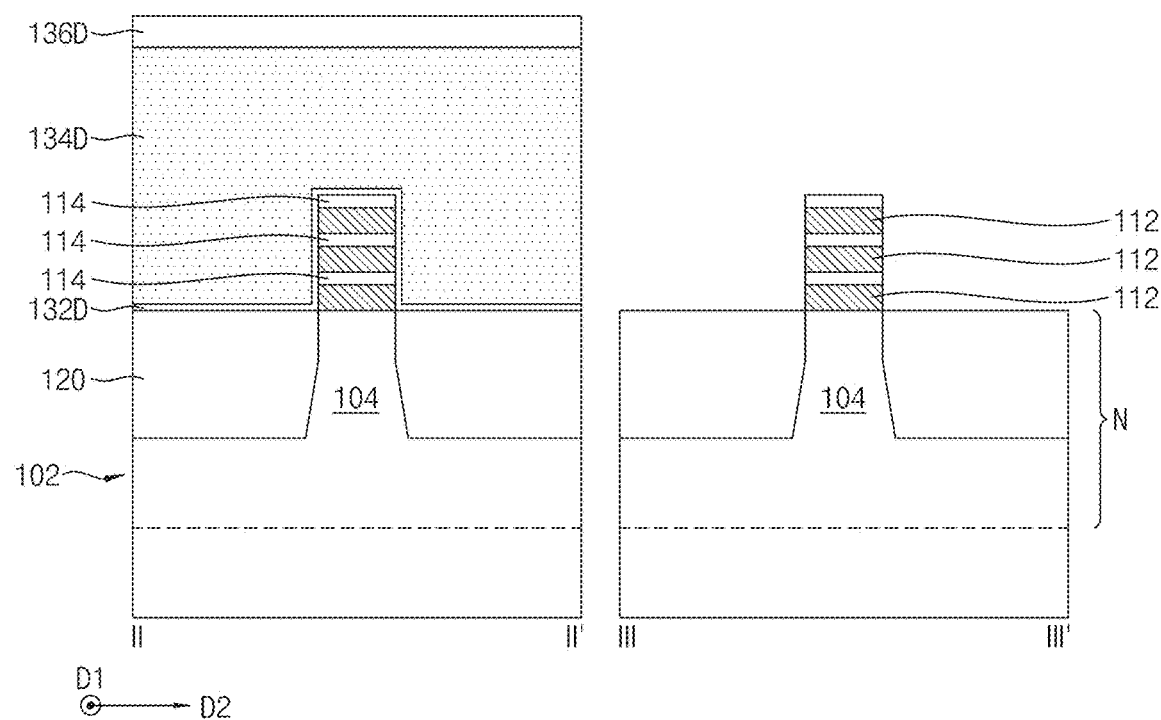

Referring to FIGS. 6A and 6B, a dummy gate structure 130D and a gate spacer 140 may be formed on the stack 110. The dummy gate structure 130D may extend in the second horizontal direction D2 across the active region 104. The dummy gate structure 130D may include a dummy gate insulating layer 132D, a dummy gate electrode 134D, and a dummy capping layer 136D that are sequentially stacked. The gate spacer 140 may cover a side surface of the dummy gate structure 130D and may be formed of one or more layers. The gate spacer 140 may be formed by depositing an insulating material on the dummy gate structure 130D and anisotropically etching the insulating material.

The dummy gate insulating layer 132D may include silicon oxide, and may be formed by a method such as CVD or ALD. The dummy gate electrode 134D may include polysilicon. The dummy capping layer 136D may include silicon nitride, silicon oxynitride, or a combination thereof. The gate spacer 140 may include silicon nitride, silicon oxynitride, or a combination thereof.

Figure 7A:
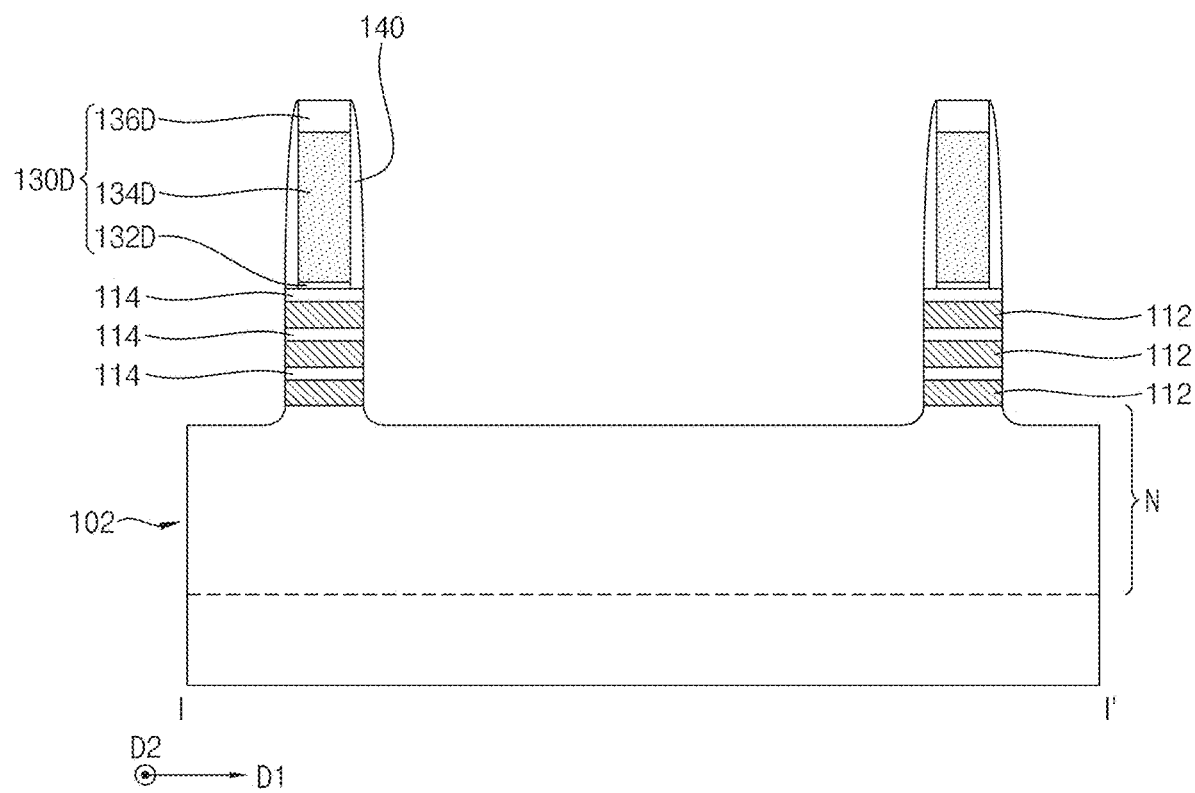
Figure 7B:
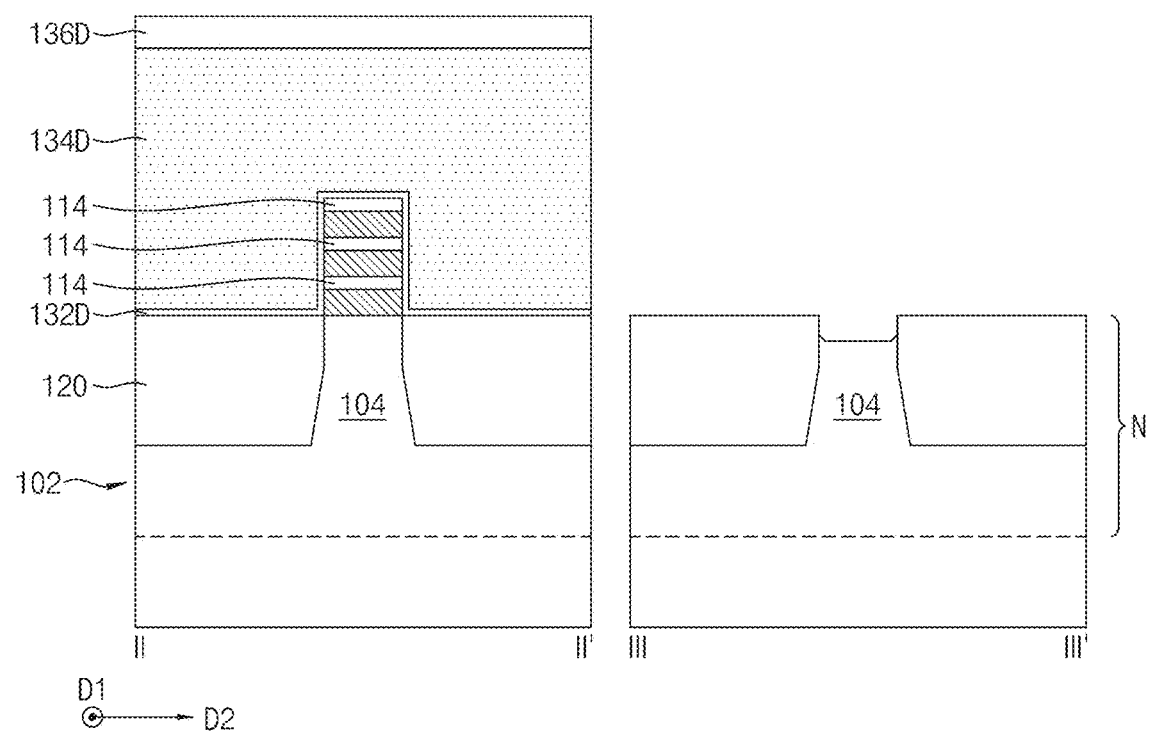

Referring to FIGS. 7A and 7B, the sacrificial layer 112 and the channel layer 114 that are not covered by the dummy gate structure 130D may be removed. The sacrificial layer 112 and the channel layer 114 may be anisotropically etched using the gate spacer 140 as an etch mask. The upper surface of the active region 104 may be exposed by the etching process. In an example embodiment, an upper portion of the active region 104 may be recessed.

Referring to FIG. 8, an inner spacer 142 may be formed. The inner spacer 142 may be formed in a space where the sacrificial layer 112 is removed after etching a portion of a side surface of the sacrificial layer 112. For example, after forming a recess on the side of the sacrificial layer 112 and depositing an insulating material on the recess, an anisotropic etching process may be performed. The channel layers 114 may not be etched in the inner spacer 142 forming process.

The inner spacer 142 may be formed on the side surface of the sacrificial layer 112. In addition, the inner spacers 142 may be deposited between the plurality of the channel layers 114 and between the channel layer 114 and the active region 104. An outer surface of the inner spacer 142 may be coplanar with an outer surface of the channel layer 114. The inner spacer 142 may include silicon nitride.

Figure 9A:
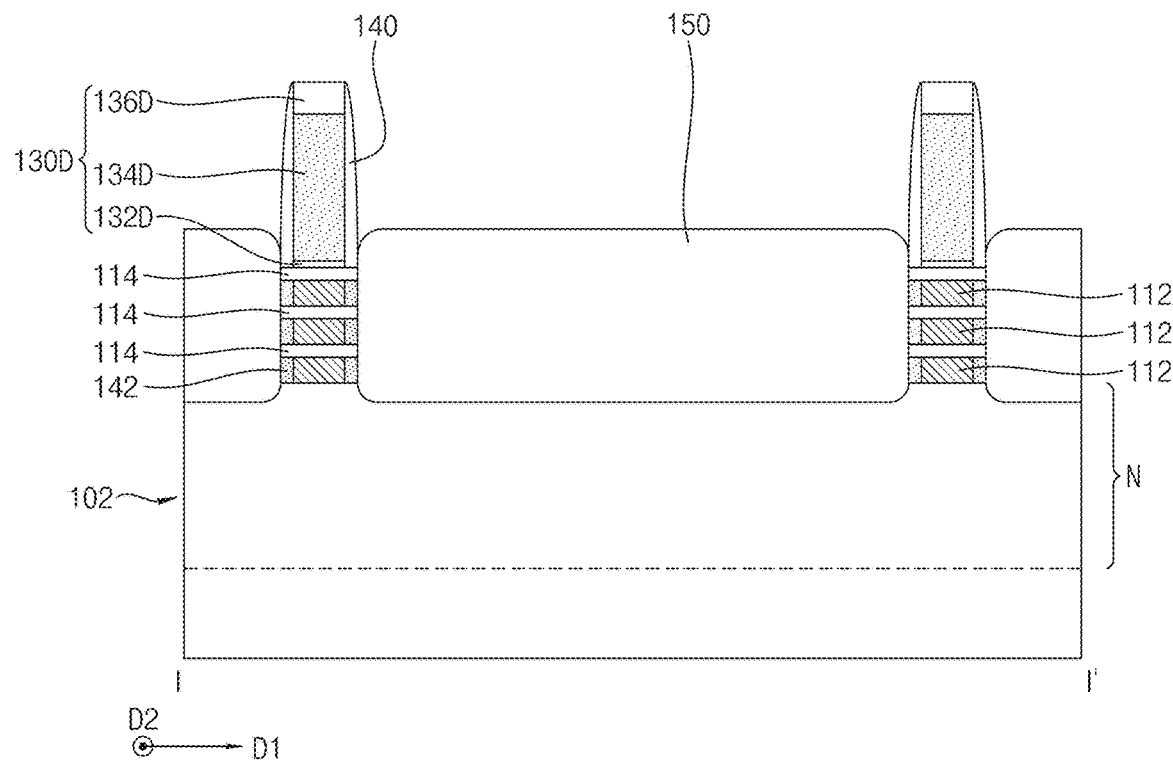
Figure 9B:
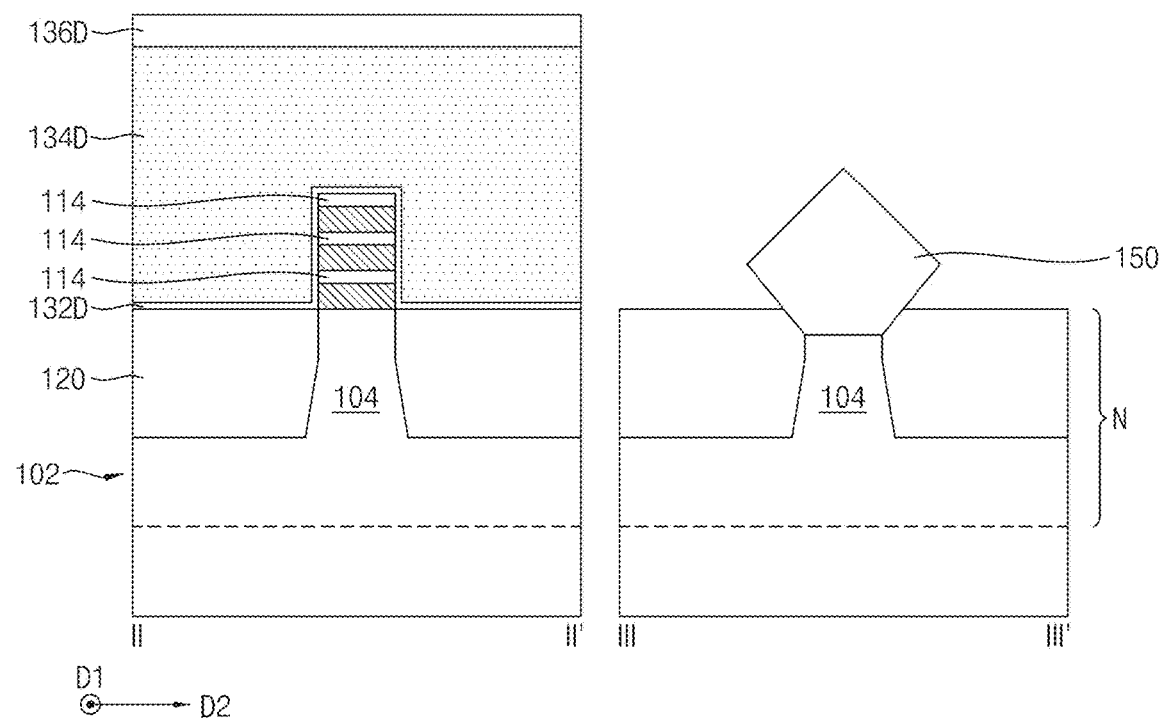

Referring to FIGS. 9A and 9B, a doped region 150 may be formed on side surfaces of the dummy gate structure 130D. The doped region 150 may be formed on the active region 104 and may extend in the first horizontal direction D1. The doped region 150 may be formed by a selective epitaxial growth (SEG) process. In an example embodiment, the doped region 150 may be doped with n-type impurities. Phosphorus (P), arsenic (As), etc. may be used as the n-type impurity. In an example embodiment, the doped region 150 may have a pentagon-shaped cross section. However, it is not limited thereto.

Figure 10A:
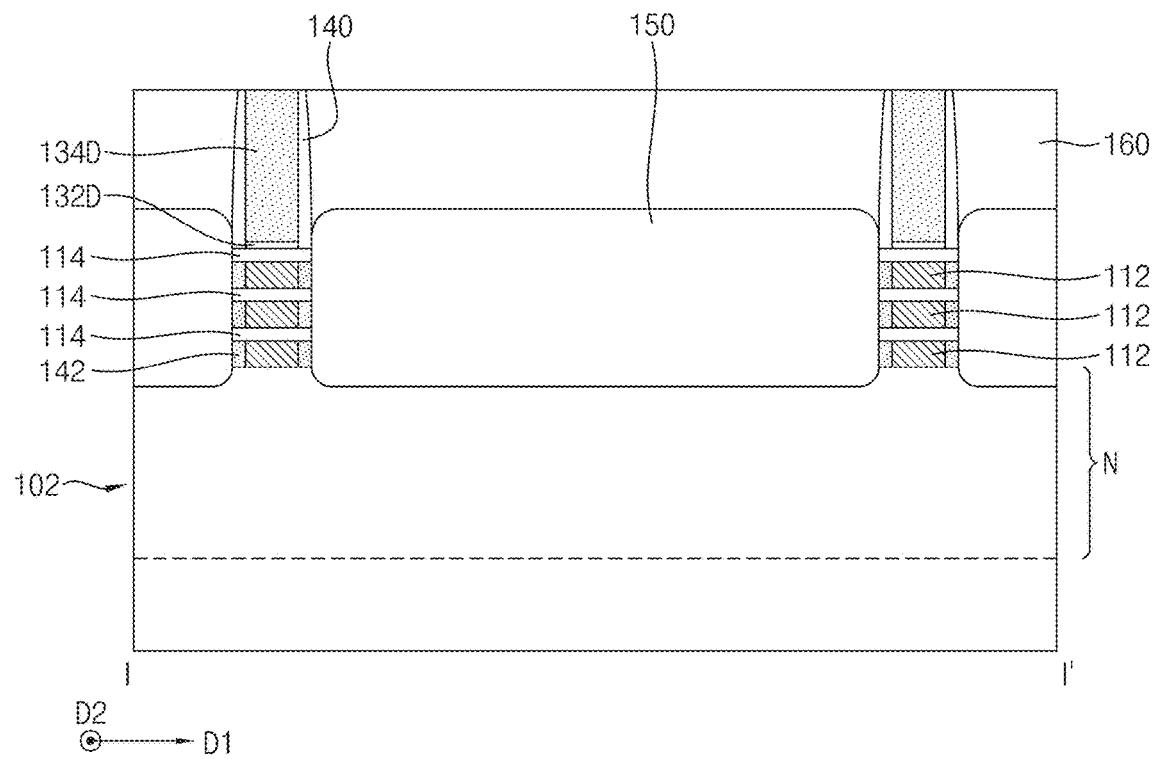
Figure 10B:
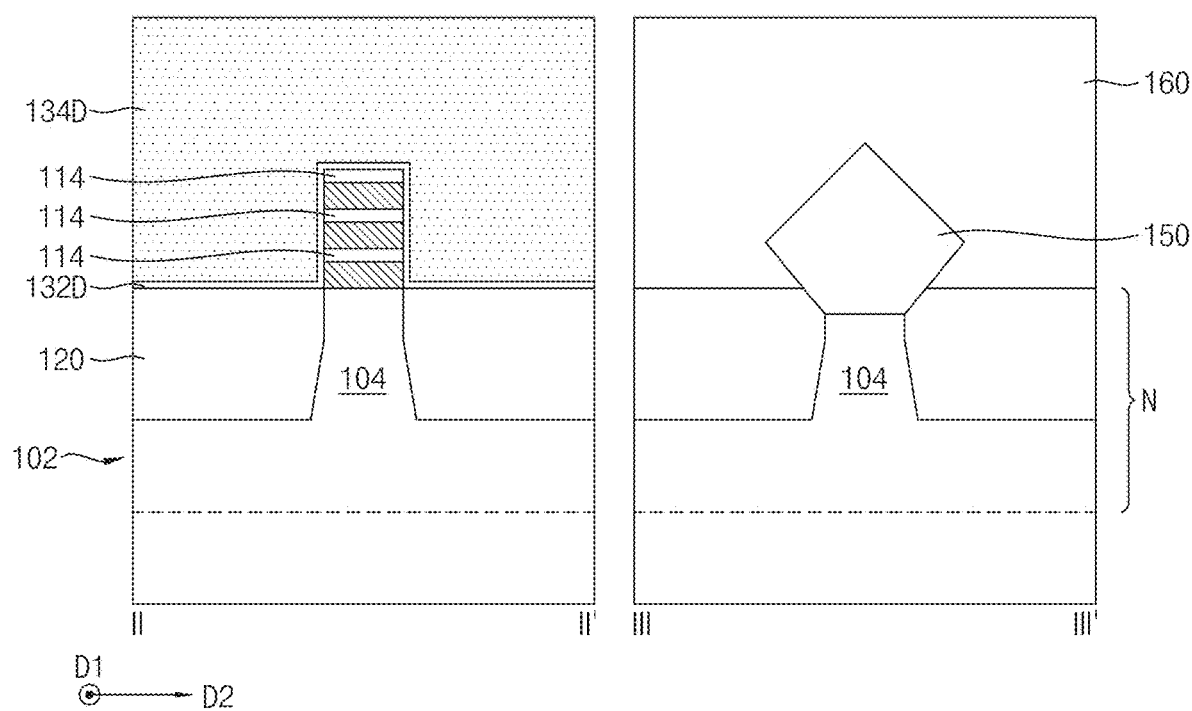

Referring to FIGS. 10A and 10B, an interlayer insulating layer 160 may be formed. The interlayer insulating layer 160 may cover the device isolation layer 120, side surfaces of the gate spacer 140, and the doped region 150. The interlayer insulating layer 160 may fill a space between the doped region 150 and the device isolation layer 120. The interlayer insulating layer 160 may include silicon oxide, silicon nitride, silicon oxynitride, or low dielectric material. After the interlayer insulating layer 160 is formed, the dummy capping layer 136D may be removed by the planarization process and an upper surface of the dummy gate electrode 134D may be exposed.

Figure 11A:
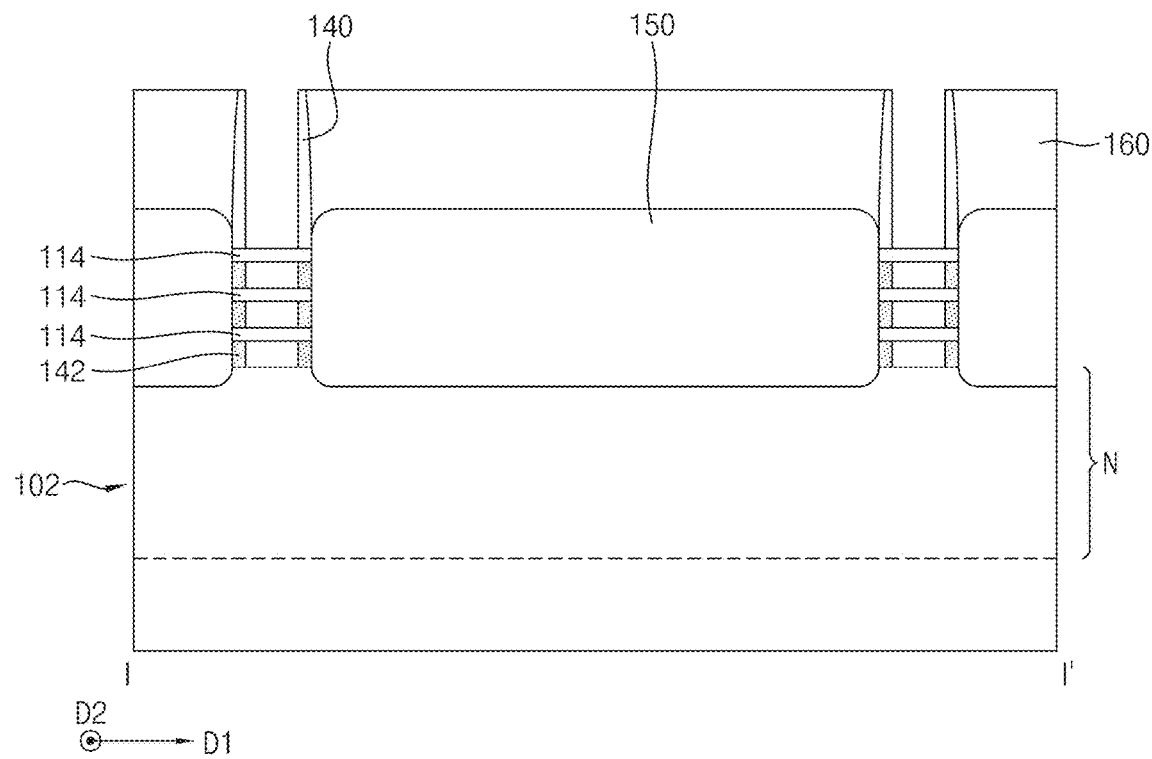
Figure 11B:
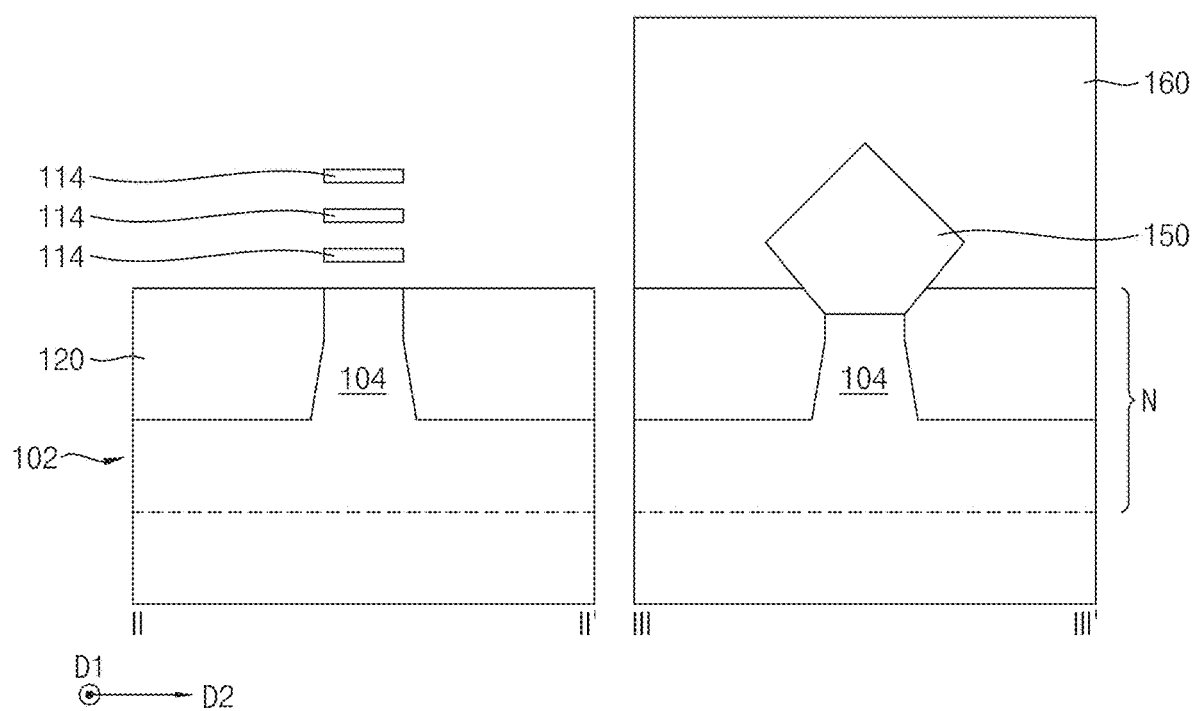

Referring to FIGS. 11A to 11B, the dummy gate structure 130D may be removed. After first removing the dummy gate electrode 134D and the dummy gate insulating layer 132D, the exposed sacrificial layer 112 may be removed by a wet etching process. The gate spacer 140 and the inner spacer 142 may not be removed in the etching process.

Figure 12A:
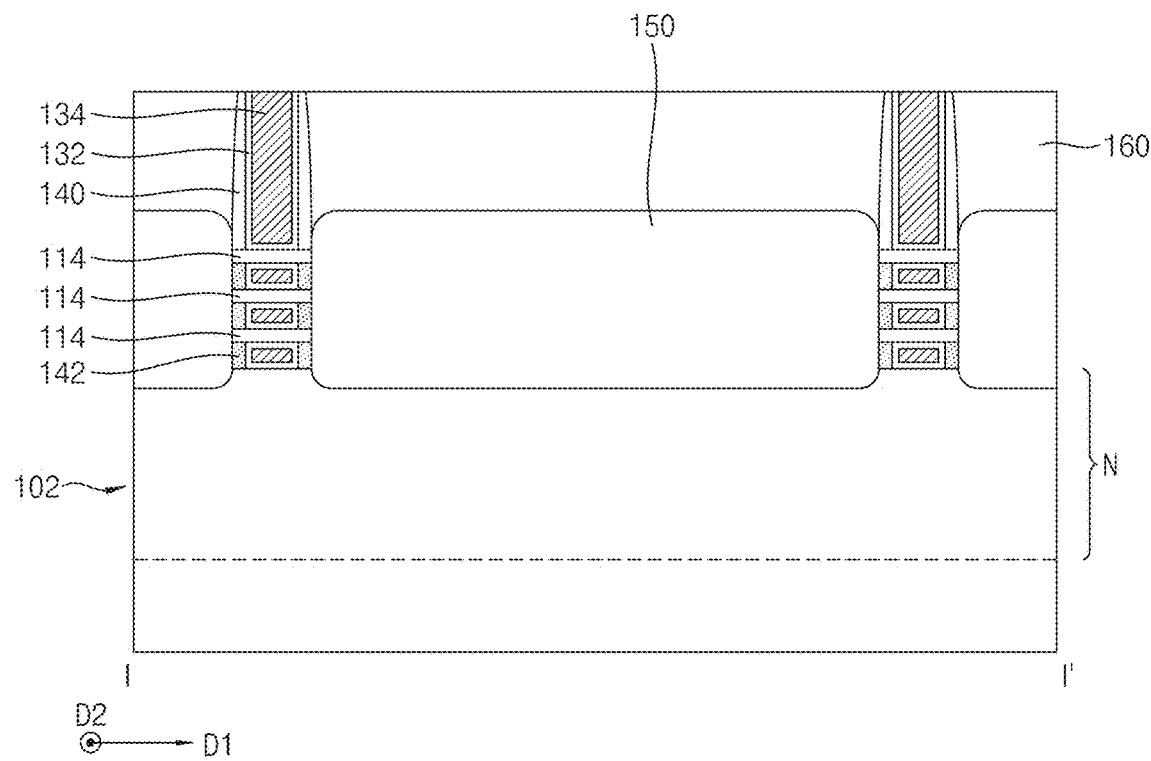
Figure 12B:
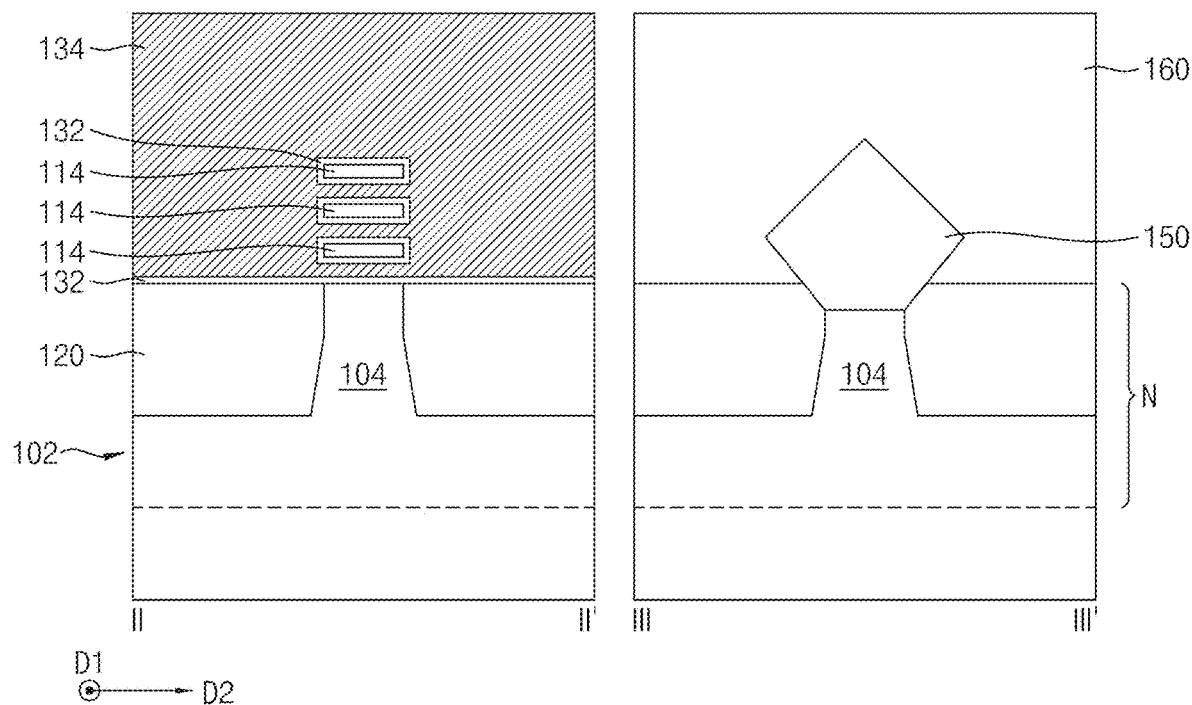

Referring to FIGS. 12A and 12B, a gate dielectric layer 132 and a gate electrode 134 may be formed in a space in which the dummy gate insulating layer 132D and the dummy gate electrode 134D are removed. The gate electrode 134 may extend in the second horizontal direction D2. The gate dielectric layer 132 may be conformally formed along surfaces of the device isolation layer 120, the channel layer 114, the gate spacer 140, and the inner spacer 142. The gate electrode 134 may be formed on the gate dielectric layer 132 and may surround the plurality of channel layers 114.

Referring back to FIGS. 1, 2, 3A and 3B, a capping layer 170 covering upper surfaces of the gate electrode 134, the gate spacer 140, and the interlayer insulating layer 160 may be formed. The capping layer 170 may include silicon oxide, silicon nitride, silicon oxynitride, or a combination thereof.

After forming the capping layer 170, a contact plug 180 passing through the capping layer 170 and the interlayer insulating layer 160 may be formed. The contact plug 180 may contact an upper portion of the doped region 150. A silicide layer 182 may be formed below the contact plug 180. The silicide layer 182 may be disposed between the doped region 150 and the contact plug 180. The contact plug 180 may include W, Co, Cu, Al, Ti, Ta, TiN, TaN, or a combination thereof.

Figure 13:
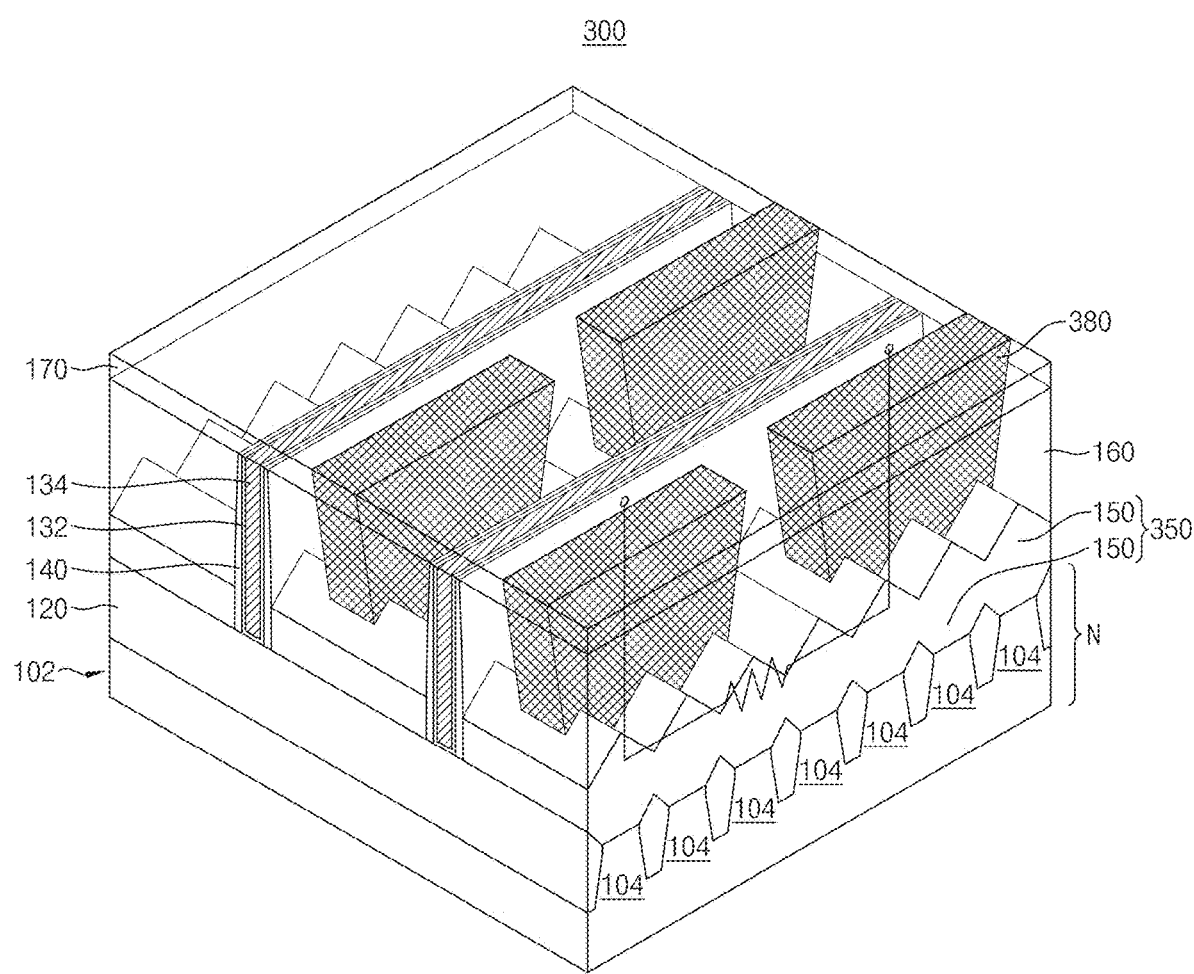
FIG. 13 is a perspective view of a resistor according to an example embodiment of inventive concepts.
Figure 14:
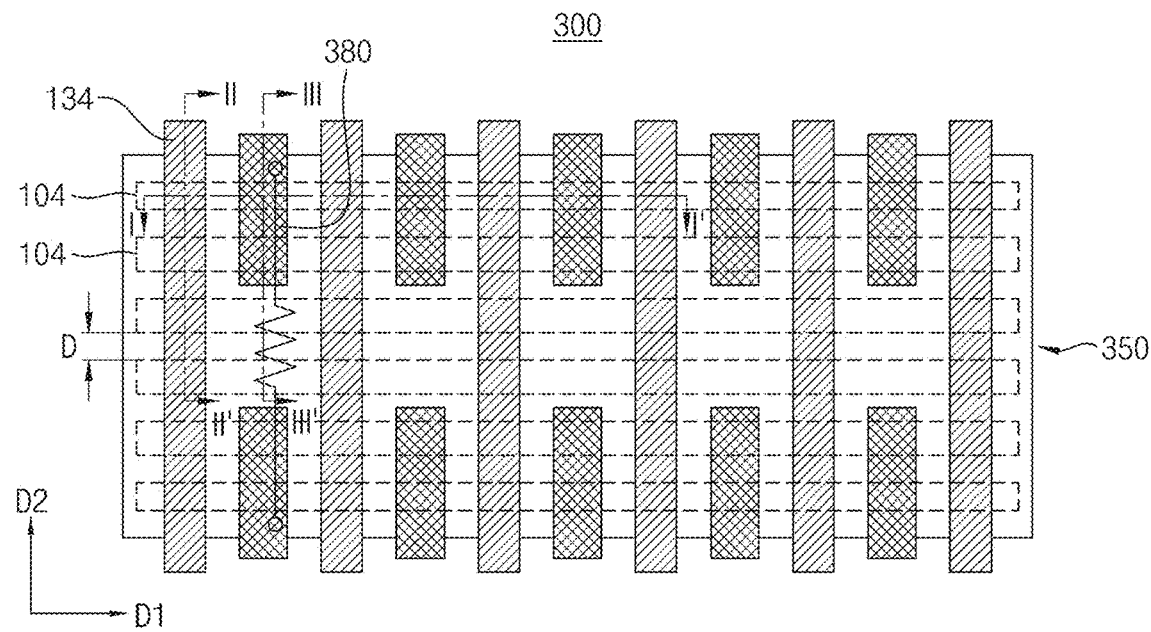
FIG. 14 is a layout of the resistor shown in FIG. 13.
Figure 15A:
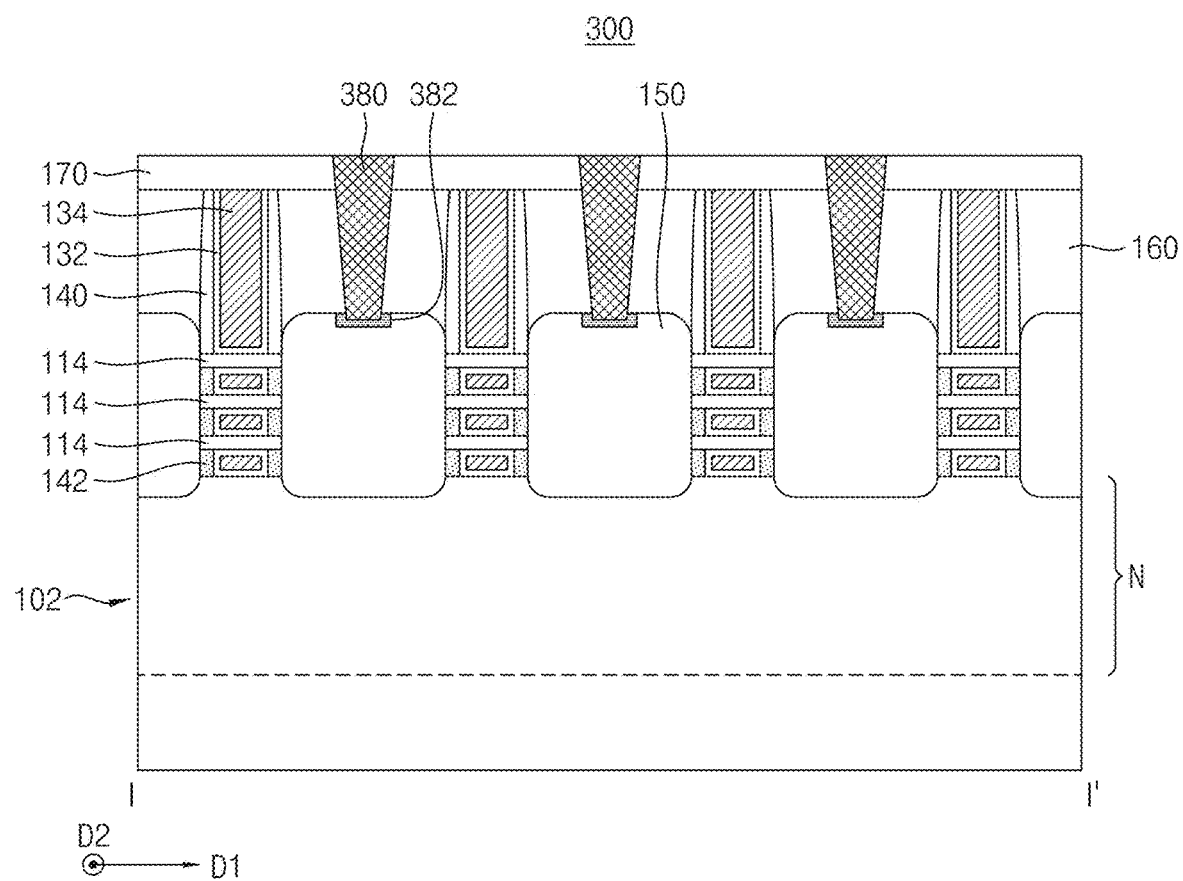
FIGS. 15A-15B are vertical cross-sectional views of the resistor shown in FIG. 14, taken along lines I-I', II-II', and III-III'.
Figure 15B:
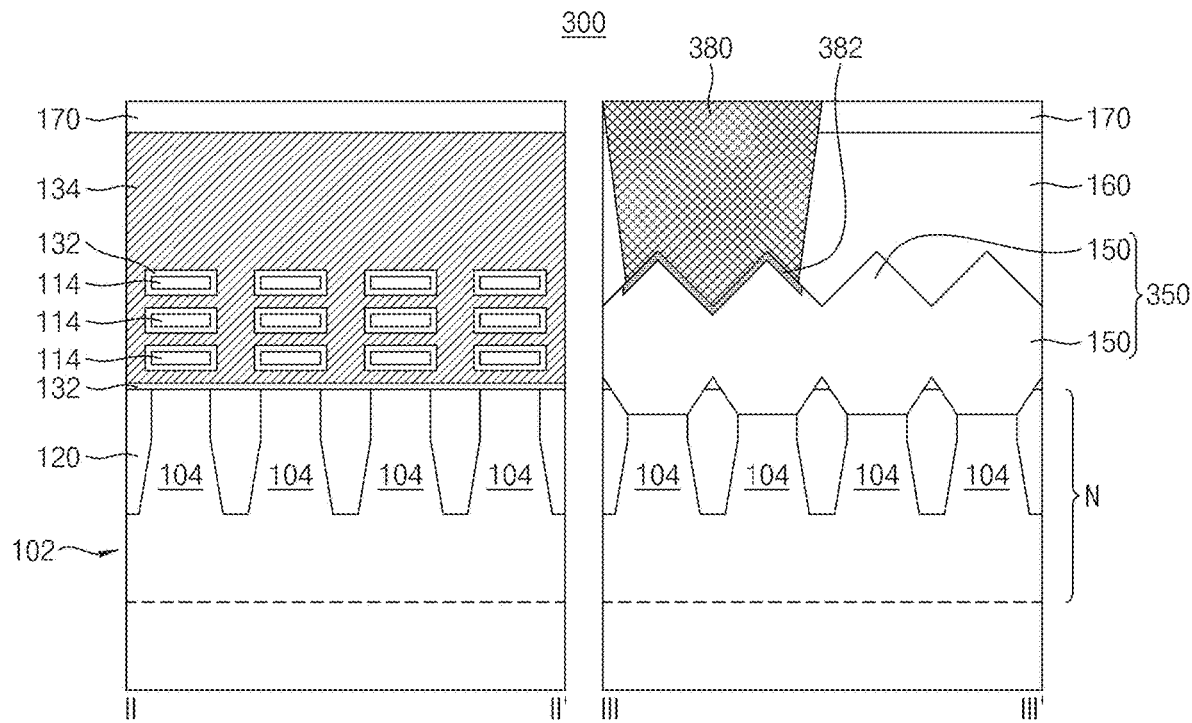

FIG. 13 is a perspective view of a resistor according to an example embodiment of inventive concepts. FIG. 14 is a layout of the resistor shown in FIG. 13. FIGS. 15A-15B are vertical cross-sectional views of the resistor shown in FIG. 14, taken along lines I-I', II-II', and III-III'. Detailed descriptions of the same or similar components as the resistor 100 illustrated in FIGS. 1, 2, 3A, and 3B may be omitted.

Referring to FIGS. 13, 14, 15A and 15B, a resistor 300 may include a resistive structure 350 including the plurality of doped regions 150 and a contact plug 380.

The resistor 300 may include the plurality of active regions 104 extending in the first horizontal direction D1, and the plurality of active regions 104 may be spaced apart from each other along the second horizontal direction D2.

Each of the plurality of doped regions 150 may be disposed on the plurality of active regions 104, and may be disposed on side surfaces of each of the plurality of gate electrodes 134. In an example embodiment, the spacing between the plurality of active regions 104 in the resistor 300 may be formed to be smaller than the spacing between the plurality of active regions 104 in the transistor. For example, the distance D between the active regions 104 may be 10 nm to 12 nm. Accordingly, the plurality of doped regions 150 disposed on the plurality of active regions 104 may be integrally connected to form the resistive structure 350. An upper surface of the resistive structure 350 may not be flat. In an example embodiment, the upper surface of the resistive structure 350 may include alternately disposed protruding patterns and depression patterns. A lower surface of the resistive structure 350 may contact the upper surfaces of the plurality of active regions 104.

The contact plug 380 may penetrate the interlayer insulating layer 160 and the capping layer 170 vertically to contact the upper surface of one or more doped regions 150 of the plurality of doped regions 150. In an example embodiment, the contact plug 380 may contact the two doped regions 150. However, the present invention is not limited thereto, and the contact plug 380 may contact one doped region 150 or three or more doped regions 150. The plurality of contact plugs 380 may be electrically connected through the resistive structure 350. A silicide layer 382 may be further disposed under the contact plug 380. The silicide layer 382 may be disposed between the doped region 150 and the contact plug 380.

In an example embodiment, the resistance of the resistor 300 may vary depending on the number of connected doped regions 150. For example, if the number of connected doped regions 150 increases, the resistance of the resistor 300 may increase. In addition, if the vertical height of the plurality of doped regions 150 increases, the resistance of the resistor 300 may decrease.

Figure 16:
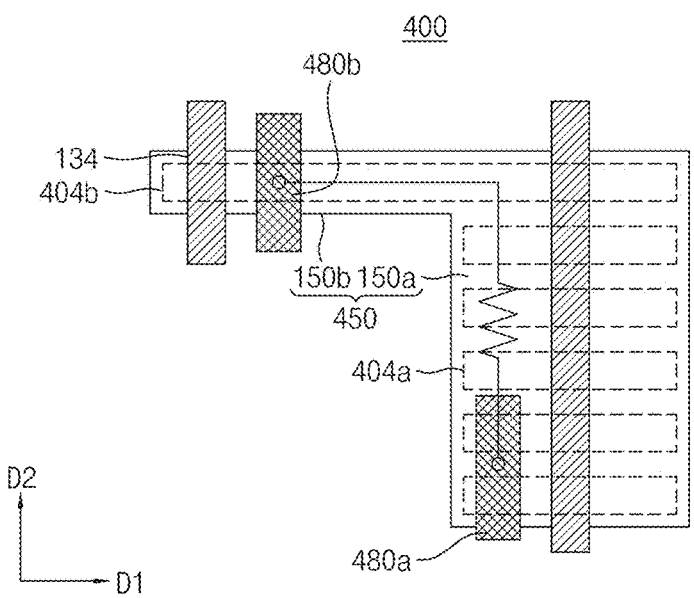
FIG. 16 is a layout of a resistor according to an example embodiment of inventive concepts.

FIG. 16 is a layout of a resistor according to an example embodiment of inventive concepts.

Referring to FIG. 16, a resistor 400 may include a resistive structure 450 connected to a first contact plug 480a and a second contact plug 480b. The resistor 400 may also include a first active region 404a, a second active region 404b, a first doped region 150a, and a second doped region 150b.

The first active region 404a and the second active region 404b may extend in the first horizontal direction D1. In an example embodiment, the second active region 404b may extend beyond the first active region 404a. For example, the length in the first horizontal direction D1 of the second active region 404b may be longer than the length in the first horizontal direction D1 of the first active region 404a. The first doped region 150a and the second doped region 150b may be formed on the first active region 404a and the second active region 404b by a SEG process (e.g., at least one semiconductor layer epitaxially grown), respectively. The plurality of first doped regions 150a disposed on the plurality of first active regions 404a may be connected to each other so as to extend in the second horizontal direction D2. The plurality of connected first doped regions 150a may be integrally connected to the second doped region 150b to form the resistive structure 450. In a top view, the resistive structure 450 may have a bent shape. In an example embodiment, the resistor 400 may include a plurality of second doped regions 150b.

The first contact plug 480a and the second contact plug 480b may contact the resistive structure 450. For example, the first contact plug 480a may contact the first doped region 150a, and the second contact plug 480b may contact the second doped region 150b. The first contact plug 480a may be electrically connected to the second contact plug 480b through the resistive structure 450.

According to example embodiments of inventive concepts, the resistor may be implemented in a gate all-around structure having a channel layer in the form of a nanosheet.

While embodiments of inventive concepts have been described with reference to the accompanying drawings, it should be understood by those skilled in the art that various modifications may be made without departing from the scope of inventive concepts and without changing essential features thereof. Therefore, the above-described embodiments should be considered in a descriptive sense only and not for purposes of limitation.

What is claimed is:

1. A resistor comprising:
   a substrate including an active region protruding from an upper surface of the substrate, the active region extending in a first horizontal direction;
   a doped region extending in the first horizontal direction and comprising a semiconductor layer with n-type impurities;
   a plurality of channel layers spaced apart from each other in a vertical direction on the active region, the plurality of channel layers connected to the doped region;

a first gate electrode and a second gate electrode adjacent to the doped region and extending in a second horizontal direction intersecting the first horizontal direction, the first gate electrode and the second gate electrode surrounding the plurality of channel layers; and a first contact plug and a second contact plug in contact with an upper surface of the doped region, the first contact plug between the first gate electrode and the second gate electrode, the first contact plug being adjacent to the first gate electrode, and the second contact plug being adjacent to the second gate electrode.

2. The resistor according to claim 1, wherein the first contact plug is electrically connected to the second contact plug through the doped region.

3. The resistor according to claim 1, wherein a length in the first horizontal direction of the doped region is equal to or greater than about 100 nm.

4. The resistor according to claim 1, wherein a maximum width in the second horizontal direction of the doped region is 52 nm to 60 nm.

5. The resistor according to claim 1, wherein a height of the doped region is 52 nm to 58 nm.

6. The resistor according to claim 1, further comprising:
inner spacers in contact with side surfaces of the doped region and on lower surfaces of the plurality of channel layers.

7. The resistor of claim 1, wherein
the substrate further includes an N-well in the substrate, and
the N-well surrounds the active region.

8. The resistor according to claim 1, wherein the doped region is epitaxially grown from the active region.

9. The resistor according to claim 1, wherein the upper surface of the doped region has a concave intermediate portion.

10. The resistor according to claim 1, the doped region has a pentagon-shaped cross section.

11. A resistor comprising:
a substrate including a plurality of first active regions protruding from an upper surface of the substrate, the plurality of first active regions extending in a first horizontal direction;
a resistive structure including a semiconductor layer with a plurality of first doped regions connected to each other, each of the plurality of first doped regions being on the plurality of the first active regions and including n-type impurities;
a plurality of channel layers spaced apart from each other in a vertical direction on the plurality of first active regions, each of the plurality of channel layers being connected to the plurality of first doped regions;
a first gate electrode extending in a second horizontal direction intersecting the first horizontal direction, the first gate electrode surrounding the plurality of channel layers; and
at least one first contact plug in contact with an upper surface of the resistive structure and adjacent to the first gate electrode.

12. The resistor according to claim 11, wherein a distance between adjacent first active regions among the plurality of first active regions is 10 nm to 12 nm.

13. The resistor according to claim 11, wherein the resistive structure extends in the second horizontal direction.

14. The resistor according to claim 11, wherein an upper surface of the resistive structure comprises alternately disposed protruding patterns and depression patterns.

15. The resistor according to claim 11, wherein
the substrate further includes an N-well in the substrate, and
the N-well surrounds at least one of the plurality of first active regions.

16. The resistor according to claim 11, further comprising:
inner spacers on the substrate, each of the inner spacers contacting a side surface of a corresponding one of the plurality of first doped regions and on a lower surface of a corresponding one of the plurality of channel layers.

17. The resistor according to claim 11, further comprising:
a second gate electrode extending in the second horizontal direction, wherein
the substrate further includes a second active region extending beyond the plurality of first active regions in the first horizontal direction,
the second gate electrode crosses the second active region,
the resistive structure further includes a second doped region in the semiconductor layer,
the second doped region is on the second active region, and
the second doped region extends in the first horizontal direction and is connected to the plurality of first doped regions.

18. The resistor according to claim 17, wherein the resistive structure has a bent shape in a top view.

19. The resistor according to claim 17, further comprising:
a second contact plug in contact with an upper surface of the second doped region, wherein
the second contact plug is adjacent to the second gate electrode.

20. A resistor comprising:
a substrate including an active region and an N-well,
the active region protruding from an upper surface of the substrate, the active region extending in a first horizontal direction, the N-well in the substrate and surrounding the active region;
a doped region on the active region and comprising a semiconductor layer with n-type impurities, a maximum width of the doped region in a second horizontal direction intersecting the first horizontal direction being 52 nm to 60 nm;
a plurality of channel layers spaced apart from each other in a vertical direction on the active region, the plurality of channel layers connected to the doped region;
inner spacers in contact with side surfaces of the doped region, the inner spacers on lower surfaces of the plurality of channel layers;
a gate dielectric layer surrounding the plurality of channel layers;
a first gate electrode and a second gate electrode extending in the second horizontal direction and surrounding the plurality of channel layers and the gate dielectric layer; and
a first contact plug and a second contact plug in contact with an upper surface of the doped region, the first contact plug between the first gate electrode and the second gate electrode, the first contact plug adjacent to the first gate electrode, and the second contact plug adjacent to the second gate electrode.

\* \* \* \* \*

UNITED STATES PATENT AND TRADEMARK OFFICE
CERTIFICATE OF CORRECTION

| | |
|---|---|
| PATENT NO. | : 11,217,578 B2 |
| APPLICATION NO. | : 16/911795 |
| DATED | : January 4, 2022 |
| INVENTOR(S) | : Woocheol Shin et al. |

It is certified that error appears in the above-identified patent and that said Letters Patent is hereby corrected as shown below:

On the Title Page

Should be added, Column 1:
(30) Foreign Application Priority Data
December 9, 2019 (KR) .................10-2019-0162831

Signed and Sealed this
Eleventh Day of July, 2023

Katherine Kelly Vidal
*Director of the United States Patent and Trademark Office*